(12) United States Patent
Akaogi

(10) Patent No.: US 6,487,060 B1
(45) Date of Patent: Nov. 26, 2002

(54) OXIDE PROTECTION FOR A BOOSTER CIRCUIT

(75) Inventor: Takao Akaogi, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/916,382

(22) Filed: Jul. 27, 2001

Related U.S. Application Data

(60) Provisional application No. 60/294,545, filed on May 30, 2001.

(51) Int. Cl.$^7$ .................................................. H02H 3/22
(52) U.S. Cl. ...................................................... 361/111
(58) Field of Search ............................ 361/111, 88, 89, 361/113, 115; 327/538, 540, 541, 545

(56) References Cited

U.S. PATENT DOCUMENTS 4,878,201 A * 10/1989 Nakaizumi 5,907,505 A * 5/1999 Tomita
6,191,994 B1 * 2/2001 Ooishi

* cited by examiner

*Primary Examiner*—Edward H. Tso
(74) *Attorney, Agent, or Firm*—Coudert Brothers LLP

(57) ABSTRACT

A protection system that protects a booster circuit used to boost operating signals in a memory device. The system includes a protection circuit for protecting an output transistor of the booster circuit. The protection circuit includes a transfer gate coupled to the output transistor and coupled to receive a first boost signal and a second boost signal. The transfer gate opens and closes in response to the second boost signal. When the transfer gate is closed, the first boost signal is uncoupled from the output transistor, and when the transfer gate is opened, the first boost signal is coupled to the output transistor. The circuit also includes a protection transistor coupled to the second boost signal, a supply voltage and the output transistor, where the protection transistor couples the supply voltage to the output transistor when the transfer gate is closed.

17 Claims, 2 Drawing Sheets

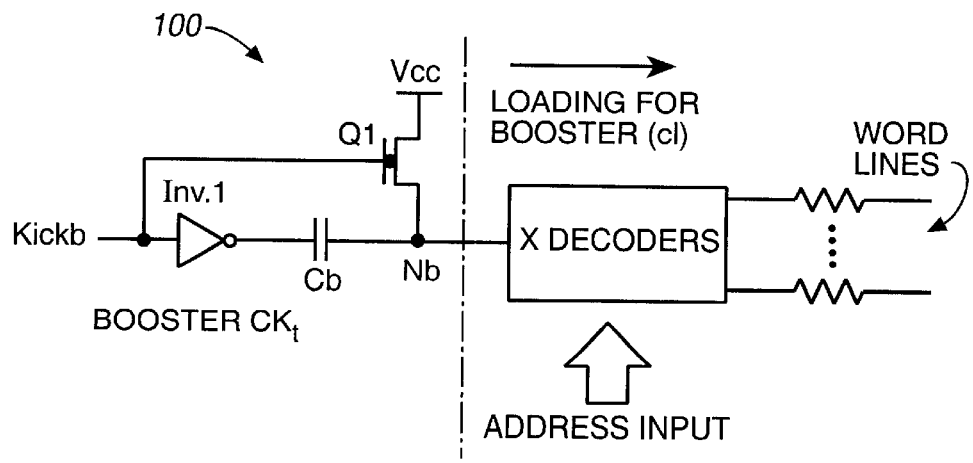
FIG._1
*(PRIOR ART)*
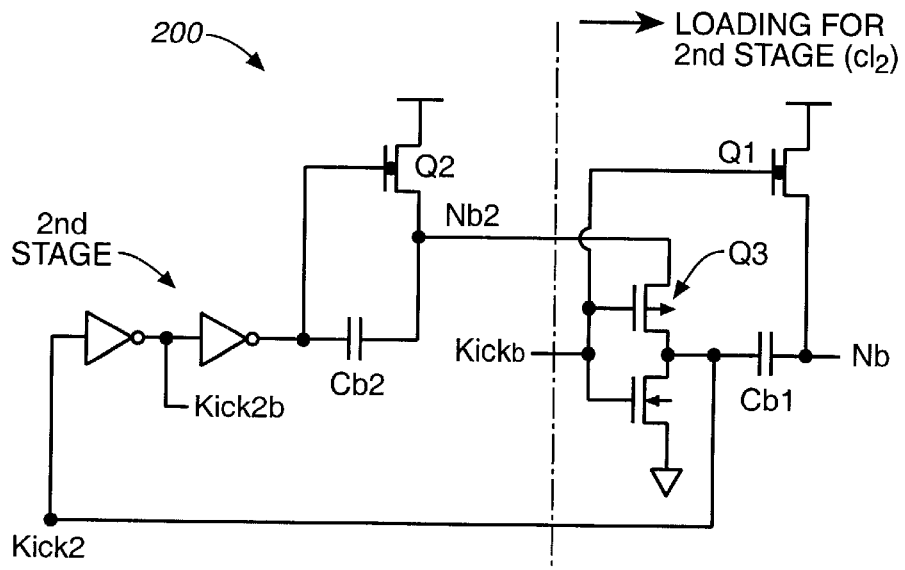
FIG._2
*(PRIOR ART)*

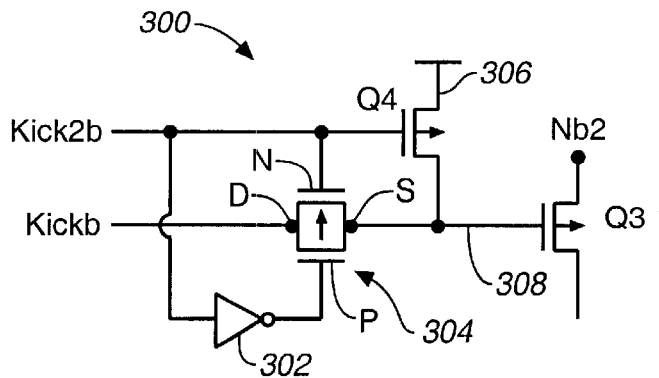
FIG._3
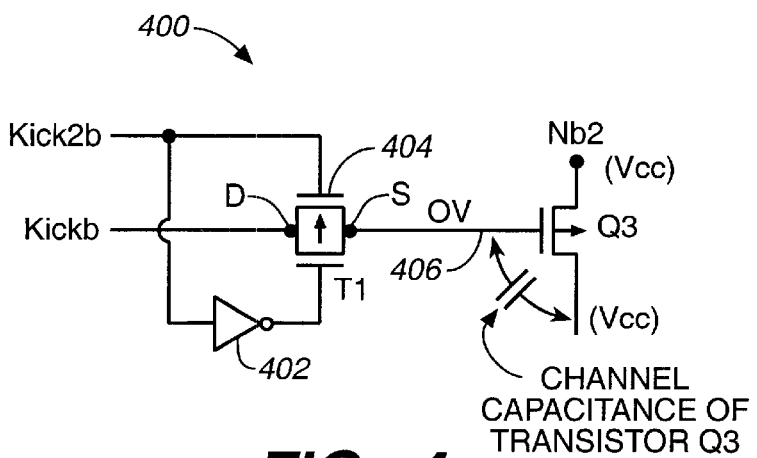
FIG._4
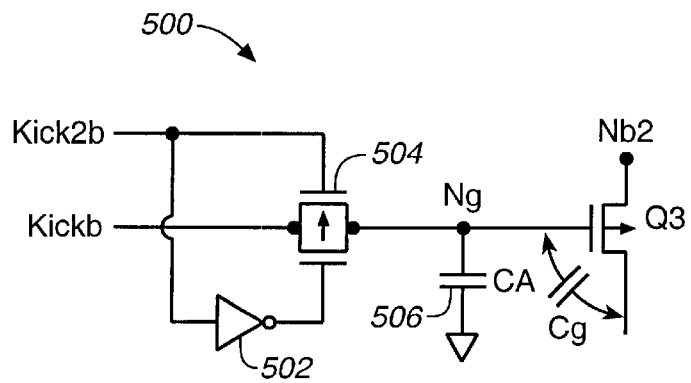
FIG._5

OXIDE PROTECTION FOR A BOOSTER CIRCUIT

CROSS REFERENCE TO RELATED APPLICATIONS

This application claims priority from a U.S. Provisional Patent Application entitled, "OXIDE PROTECTION FOR A BOOSTER CIRCUIT" filed on May 30, 2001 and having Application No. 60/294,545. The disclosure of which in incorporated herein in its entirety for all purposes.

FIELD OF THE INVENTION

The present invention relates generally to boost circuits for use in low-power memory devices, and more particularly, to a protection circuit that allows a high-speed transistor to be used in a boost circuit for a low-power memory device.

BACKGROUND OF THE INVENTION

For low voltage operation of a memory device, for example a "Flash" memory device, a word line voltage-boosting scheme is used to boost the voltage levels of word line signals used to operate the memory. However, typical boosting circuits may damage or stress high-speed memory components (i.e., transistors) and require the use of more robust memory components that operate at lower speeds.

FIG. 1 shows a typical boosting circuit 100 for use in a flash memory device. Transistor (Q1) is a depletion N-channel transistor that has a negative voltage threshold (Vt) approximately equal to −1.0 volts. As a result, the voltage at node Nb is set to Vcc when a boost activation input signal (Kickb) is at a high level. The Kickb signal being a signal used to operate the memory device during burst mode when signal boosting is required.

The node Nb is connected to Xdecoder circuits that select one of multiple word lines according to an address input. The Xdecoder circuits and word lines also act as loading capacitance for the booster circuit output. When the Kickb signal transitions from a high to low level, the voltage on node Nb is boosted and becomes:

$$Vnb = Vcc + (Cb/(Cb+Cl))*Vcc \quad (1)$$

The Xdecoder applies the boosted voltage to a selected word line. From the above equation, it can be seen that the boosted voltage cannot be higher than 2*Vcc. However, the boosted voltage is required to go higher for super low Vcc operation, for example, when Vcc is approximately equal to 1.8 volts. In this case a multi-stage booster is used.

FIG. 2 shows a typical two-stage boost circuit 200 that can generate a boosted voltage higher than 2*Vcc. When the Kickb signal is at a high level "H", then Nb and Nb2 voltages are set to Vcc through transistors Q2 and Q1. When the Kickb signal goes to a low level "L", the node Nb voltage is boosted in the same manner as specified in the equation (1) above. Some time later, the second stage booster boosts the node Nb2 voltage to a level that is higher than Vcc according to the expression:

$$Vnb = Vcc + (Cb/(Cb+Cl))*Vnb2$$

where $$Vnb2 = Vcc + (Cb2/(Cb2+Cl2))*Vcc$$

and $$Cl2 = (Cb1*Cl)/(Cb1+Cl)$$

Thus, from the above equations the voltage at Nb2 could be as much as 2*Vcc, so that just less than 3*Vcc is also possible on the node Nb.

Unfortunately these high voltage levels may cause damage to the circuit components. For example, the booster circuit is required to operate at high speed. In order to have fast boosting speed, a high-speed transistor should be used for transistor Q3. However, a high speed transistor for Q3 has thin gate oxide. When the node Nb2 is boosted higher than Vcc, the transistor Q3 may have excess voltage stress across its gate oxide (i.e. its drain to gate voltage may exceed specified limits), which may cause the gate oxide to break down and Q3 to fail. Simply replacing Q3 with a transistor having a thicker gate oxide creates another problem, since such a transistor operates at a slower speed and would negatively impact the speed of the booster circuit.

Therefore is would be desirable to have a booster circuit that maintains high operating speed without risking transistor failure due to oxide breakdown occurring as a result of the boosted voltage levels.

SUMMARY OF THE INVENTION

The present invention includes a protection system that provides protection for a booster circuit used in memory devices to boost operating signals of the device. The protection system allows operating signals to be boosted without causing component failures due to the effect of the boosted voltages.

In one embodiment of the invention, the protection system adjusts the voltage on a gate terminal of a high-speed transistor used in a boost circuit. The adjusted gate voltage reduces stress on the gate oxide (i.e. by adding voltage to the gate terminal) and thereby averts gate failure of the high speed transistor. In another embodiment of the invention, the protection system capacitively couples a selected capacitance to a gate terminal of a high-speed transistor used in a booster circuit. As a result, the gate voltage is adjusted to reduce the gate oxide stress and avert gate failure of the high-speed transistor.

In one embodiment of the invention, a protection circuit is provided for protecting an output transistor of a boost circuit that boosts the voltage level of a memory signal used to operate a memory device. The protection circuit includes a transfer gate coupled to the output transistor and coupled to receive a first boost signal and a second boost signal. The transfer gate is operable to open and close in response to the second boost signal. When the transfer gate is closed the first boost signal is uncoupled from the output transistor, and when the transfer gate is opened the first boost signal is coupled to the output transistor. The protection circuit also includes a protection transistor coupled to the second boost signal, a supply voltage and the output transistor. When the transfer gate is opened in response to the second boost signal, the protection transistor operates to couple the supply voltage to the output transistor.

In one embodiment of the invention, a protection circuit is provided for protecting an output transistor of a boost circuit that boosts the voltage level of a memory signal used to operate a memory device. The output transistor has a channel capacitance between its gate and source terminals. The protection circuit includes a transfer gate coupled to receive a first boost signal and a second boost signal. The transfer gate is operable to open and close based on the second boost signal, wherein when the transfer gate is open the first boost signal is coupled to the gate terminal of the output transistor, and wherein when the transfer gate is closed the first boost signal is uncoupled from the gate terminal of the output transistor. When the first boost signal is uncoupled from the gate terminal, a voltage level on the gate terminal increases due to the channel capacitance. The protection circuit further includes an inverter coupled to the second boost signal and the transfer gate.

In one embodiment of the invention, a method is provided for protecting an output transistor of a boost circuit that boosts the voltage level of a memory signal used to operate a memory device. The method includes steps of receiving first and second boost signals, gating the first boost signal, wherein the first boost signal is selectively coupled and uncoupled to the output transistor in response to the second boost signal, and adding voltage to a gate terminal of the output transistor when the first boost signal is uncoupled from the output transistor.

BRIEF DESCRIPTION OF THE DRAWINGS

The forgoing aspects and the attendant advantages of this invention will become more readily apparent by reference to the following detailed description when taken in conjunction with the accompanying drawings wherein:

FIG. 1 shows a typical boost circuit for use with a memory device;

FIG. 2 shows a detailed view of a typical two-stage boost circuit for use with a memory device;

FIG. 3 shows one embodiment of a booster protection circuit constructed in accordance with the present invention;

FIG. 4 shows another embodiment of a booster protection circuit constructed in accordance with the present invention; and FIG. 5 shows another embodiment of a booster protection circuit constructed in accordance with the present invention.

DETAILED DESCRIPTION OF THE INVENTION

The present invention includes a protection system that protects components of a boost circuit use in a memory device. The boost circuit is used to boost the voltage of memory operating signals. In order to avoid the problem of stressing the gate oxide of a high-speed transistor used in the boost circuit, the gate voltage of the transistor is adjusted by the protection circuit to reduce stress and thereby avert transistor failure.

Exemplary Embodiments

The following are exemplary embodiments of a protection circuit included in the present invention. The exemplary embodiments are intended to be exemplary and not restrictive of the scope of the invention. Therefore, changes or substitutions to the described embodiments are possible without deviating from the scope of the invention.

FIG. 3 shows one embodiment of a booster protection circuit 300 constructed in accordance with the present invention. The protection circuit is suitable for use as part of a multi-stage boost circuit (not shown), for example, as part of the two-stage booster circuit of FIG. 2. The protection circuit 300 includes an inverter 302, a transfer gate 304 and a transistor (Q4) 306. The transfer gate 304 includes P channel and N channel transistors coupled together at common source (S) and drain (D) terminals. Also shown is a booster circuit output transistor Q3 that may be damaged by boosted voltage levels if the booster protection circuit 300 is not used. For example, the output transistor Q3 is the same as the output transistor Q3 in FIG. 2.

The Kickb signal of the booster circuit is coupled to the transfer gate 304. The Kickb signal is a signal that is used to activate the boost function. The Kick2b signal of the booster circuit is coupled to the transistor 306 and the inverter 302. When the protection circuit 300 operates, the Kick2b signal is used to open and close the transfer gate and to operate the transistor Q4.

During operation of the protection circuit 300, when the Kick2b signal goes to a low level, transistor 306 turns on and the transfer gate 304 closes. At this time, the Kickb signal is uncoupled from the gate 308 of transistor Q3, which is pulled up to Vcc by operation of the transistor 306. This occurs at a time when the voltage at node Nb2 is at a boosted level, so that by adding some positive voltage to the gate of transistor Q3, stress on the gate oxide of transistor Q3 is avoided since the voltage difference between the transistor Q3 gate and the voltage at Nb2 is reduced. Therefore, it is possible to use a high-speed transistor having a thin gate oxide for Q3, since the failure of transistor Q3 will be avoided as a result of the additional gate voltage.

FIG. 4 shows another embodiment of a booster protection circuit 400 constructed in accordance with the present invention and suitable for use as part of a multi-stage boost circuit (not shown), for example, as part of the two-stage boost circuit of FIG. 2. The protection circuit 400 includes an inverter 402 and a transfer gate 404. The transfer gate 404 operates identically to the transfer gate 304 of FIG. 3. Also shown is a booster circuit output transistor Q3 that may be damaged by boosted voltage levels if the booster protection circuit 400 is not used.

The Kick2b signal is coupled to the inverter 402 and the transfer gate 404. When the protection circuit 400 operates, the Kick2b signal is used to open and close the transfer gate 404.

During operation of the protection circuit 400, the Kick2b signal goes to a low level that closes the transfer gate 404 and uncouples the Kickb signal from the gate 406 of transistor Q3. As node Nb2 voltage goes higher, the channel capacitance of the transistor Q3 couples up the gate 406 voltage. Thus, the gate voltage of transistor Q3 increases, which decrease the voltage differential with node Nb2 and thereby reduces stress on the gate oxide. Therefore, it is possible to use a high-speed transistor for Q3 that has a thin gate oxide, since the failure of transistor Q3 will be avoided as a result of the additional gate voltage and reduced stress.

FIG. 5 shows another embodiment of a booster protection circuit 500 constructed in accordance with the present invention and suitable for use as part of a multi-stage boost circuit (not shown), for example, as part of the two-stage boost circuit of FIG. 2. The protection circuit 500 includes an inverter 502, a transfer gate 504 and a capacitor 506 having capacitance "Ca." Also shown is a booster circuit output transistor Q3 that may be damaged by boosted voltage levels if the booster protection circuit 500 is not used.

The Kick2b signal is coupled to the inverter 502 and the transfer gate 504. When the protection circuit 500 operates, the Kick2b signal is used to open and close the transfer gate 504.

During operation of the protection circuit 500, the Kick2b signal goes to a low level and closes the transfer gate 504, which uncouples the Kickb signal from the gate of transistor Q3. As node Nb2 voltage goes higher, the capacitor 506 couples up the gate voltage. By selecting the appropriate capacitor, the gate voltage can be controlled to select the most effective operating condition for the transistor Q3.

For example, with the two-stage boosting, the node voltage at Nb2 is boosted from Vcc to the voltage at Nb2. Then the voltage on node Ng becomes:

$$Vng=(Cg/(Ca+Cg))*(Vnb2-Vcc)$$

If (Vnb2−Vng)<Vex (where Vex is the maximum allowed voltage across the gate oxide), the transistor Q3 will work most effectively due to the relatively high gate to source voltage. If (Vnb2−Vng)=Vex, then $$Vnb2-(Cg/(Ca-Cg))*(Vnb2-Vcc)=Vex$$

so, the value for Ca is given by:

$$Ca=((Vex-Vcc)/(Vnb2-Vex))*Cg$$

Thus, embodiments of the present invention protect a high speed transistor having a thin gate oxide that is used to form a high speed boost circuit. As a result, the boost circuit will operate at high-speed and not have the failure problems associated with stressing the gate oxide of the high-speed transistor, as do conventional boost circuits.

Embodiments included in the present invention have been described with reference to a two-stage boost circuit. However, the described embodiments can easily be extended to protect boost circuits having more than two stages. For example, a three-stage or four-stage boost circuit could be protected using the same inventive techniques. Thus, embodiments of the present invention are suitable to protect a high-speed output transistor in a multi-stage boost circuit having any number of stages.

It is also possible to combine one or more of the described embodiments within the scope of the invention. For example, it is possible combine the embodiment of FIG. 3 with the embodiment of FIG. 5, so that one embodiment includes both transistor 306 and capacitive element 506. Thus, the present invention includes embodiments formed from combining the above described embodiments.

The present invention includes a system that provides protection for a boost circuit for use in a memory device. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention which is set forth in the following claims.

What is claimed is:

1. A protection circuit for protecting an output transistor of a boost circuit that boosts the voltage level of a memory signal used to operate a memory device, the protection circuit comprising:
    a transfer gate coupled to the output transistor and coupled to receive a first boost signal and a second boost signal, the transfer gate operable to open and close in response to the second boost signal, wherein when the transfer gate is closed the first boost signal is uncoupled from the output transistor, and wherein when the transfer gate is opened the first boost signal is coupled to the output transistor; and
    a protection transistor coupled to the second boost signal, a supply voltage and the output transistor, wherein when the transfer gate is opened in response to the second boost signal, the protection transistor operates to couple the supply voltage to the output transistor.

2. The protection circuit of claim 1, further comprising an inverter having an inverter input coupled to the second boost signal and an inverter output coupled to the transfer gate.

3. The protection circuit of claim 1, wherein the transfer gate includes an input coupled to receive the first boost signal and an output coupled to the output transistor.

4. The protection circuit of claim 3, wherein the transfer gate comprises a first transistor coupled to a second transistor at common source and drain terminals.

5. The protection circuit of claim 4, the transfer gate output is formed by the common source terminals and is coupled to a gate terminal of the output transistor.

6. The protection circuit of claim 1, wherein the protection transistor includes a source terminal that is coupled to a gate terminal of the output transistor.

7. The protection circuit of claim 6, wherein the second boost signal is coupled to a gate terminal of the protection transistor.

8. The protection circuit of claim 1, wherein the boost circuit is a multi-stage boost circuit.

9. A protection circuit for protecting an output transistor of a boost circuit that boosts the voltage level of a memory signal used to operate a memory device, the output transistor having a channel capacitance between its gate and source terminals, the protection circuit comprising:
    a transfer gate coupled to receive a first boost signal and a second boost signal, the transfer gate operable to open and close based on the second boost signal, wherein when the transfer gate is open the first boost signal is coupled to the gate terminal of the output transistor, and wherein when the transfer gate is closed the first boost signal is uncoupled from the gate terminal of the output transistor, and wherein when the first boost signal is uncoupled from the gate terminal, a voltage level on the gate terminal increases due to the channel capacitance; and
    an inverter coupled to the second boost signal and the transfer gate.

10. The protection circuit of claim 9, further comprising a capacitive element coupled to the gate terminal of the output transistor.

11. The protection circuit of claim 9, wherein the boost circuit is a multi-stage boost circuit.

12. A method for protecting an output transistor of a boost circuit that boosts the voltage level of a memory signal used to operate a memory device, the method comprising steps of:
    receiving first and second boost signals;
    gating the first boost signal, wherein the first boost signal is selectively coupled and uncoupled to the output transistor in response to the second boost signal; and
    adding voltage to a gate terminal of the output transistor when the first boost signal is uncoupled from the output transistor.

13. The method of claim 12, wherein the step of gating is a step gating the first boost signal, wherein the first boost signal is selectively coupled and uncoupled to a gate terminal of the output transistor in response to the second boost signal.

14. The method of claim 13, further comprising a step of coupling a capacitive element to the gate terminal of the output transistor.

15. The method of claim 12, wherein the step of adding voltage is a step of coupling the output transistor to a supply voltage when the first boost signal is uncoupled from the output transistor.

16. The method of claim 15, wherein the step of coupling the output transistor to a supply voltage is a step of coupling the gate terminal of the output transistor to the supply voltage when the first boost signal is uncoupled from the gate terminal of the output transistor.

17. The method of claim 12, wherein the boost circuit is a multi-stage boost circuit.

* * * * *